United States Patent
Jun

(10) Patent No.: US 8,247,140 B2
(45) Date of Patent: Aug. 21, 2012

(54) MASK AND METHOD FOR FABRICATING THE SAME

(75) Inventor: Jea Young Jun, Chungcheongbuk-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 342 days.

(21) Appl. No.: 12/616,388

(22) Filed: Nov. 11, 2009

(65) Prior Publication Data

US 2010/0304276 A1   Dec. 2, 2010

(30) Foreign Application Priority Data

May 29, 2009  (KR) .................. 10-2009-0047456

(51) Int. Cl.
 *G03F 1/26* (2012.01)
(52) U.S. Cl. ........................................................ 430/5
(58) Field of Classification Search ............. 430/5, 322, 430/323, 324, 30; 438/719, 770
See application file for complete search history.

(56) References Cited

U.S. PATENT DOCUMENTS

| 5,851,708 | A  | * | 12/1998 | Lee ................................. 430/5 |
| 5,885,735 | A  |   | 3/1999  | Imai et al. |
| 7,754,601 | B2 | * | 7/2010  | Chen et al. .................... 438/637 |
| 2009/0176375 | A1 | * | 7/2009 | Benson et al. ................ 438/719 |

FOREIGN PATENT DOCUMENTS

| JP | 06-089021 A | 3/1994 |
| JP | 06-258815 A | 9/1994 |
| KR | 10-0555447 | 2/2006 |
| KR | 10-0634387 | 2/2006 |

* cited by examiner

*Primary Examiner* — Stephen Rosasco
(74) *Attorney, Agent, or Firm* — Marshall, Gerstein & Borun LLP

(57) ABSTRACT

A method of fabricating a mask includes sequentially depositing a phase shift layer and a light shielding layer on a transparent substrate; forming a light shielding layer pattern and a phase shift layer pattern by selectively etching the light shielding layer and the phase shift layer; forming side walls on side faces of the phase shift layer pattern; cleaning the substrate formed with the side walls; and selectively removing a portion of the light shielding layer. The side wall can be formed of an oxide formed by oxidizing the side faces of the phase shift layer pattern.

30 Claims, 7 Drawing Sheets

MASK AND METHOD FOR FABRICATING THE SAME

CROSS-REFERENCE TO RELATED APPLICATION

Priority to Korean patent application number 10-2009-0047456, filed on May 29, 2009, the disclosure of which is incorporated by reference in its entirety, is claimed.

BACKGROUND

1. Field of the Invention

The present disclosure relates to a photolithography technology, and more particularly, to a mask and a method for fabricating the same.

2. Brief Description of Related Technology

With an increase in the degree of integration of a semiconductor device, a Critical Dimension (CD) of a circuit pattern becomes finer and finer. To transfer finer circuit pattern onto a wafer using photolithography technology, a mask pattern having a more exact CD must be fabricated. The mask used in the photolithography technology is fabricated so that a mask pattern is formed on a transparent quartz substrate, the mask pattern having a layout of a circuit pattern to be transferred to a wafer. The mask pattern is formed of a phase shift layer in order to improve the resolution. As the phase shift layer, a molybdenum (Mo) layer is generally used, and the molybdenum layer can contain silicon, oxygen, and nitrogen to form an alloy thereof.

A halftone phase shift mask, in which a mask pattern is formed of a phase shift layer, is fabricated by depositing and patterning a molybdenum phase shift layer and a chromium (Cr) light shielding layer on a transparent quartz substrate and then selectively removing a light shielding layer pattern disposed on the patterned phase shift layer. A selective dry etch process is used to pattern the mask pattern, includes a phase shift layer pattern, and a cleaning process is performed after this etch process to remove process byproducts or foreign substances present on a surface of the fabricated mask. Since the phase shift layer pattern or the mask pattern is patterned by a selective dry etch process, a size of CD thereof is determined in the dry etch process. Nevertheless, since the phase shift layer pattern is corroded or lost in the subsequent cleaning process, the CD size of the phase shift layer pattern can be varied by the cleaning process.

When the CD size of the phase shift layer pattern is varied from the target CD, the mask must be re-fabricated. In the case of a CD variation in which the CD size of the phase shift layer pattern becomes smaller than the target CD, an exposure defect and a wafer pattern defect are caused since the photoresist pattern realized on the wafer has a smaller CD than the required target CD. In the case of the CD variation in which the CD size of the phase shift layer becomes smaller than the target CD, it is very difficult to subsequently correct the CD of the phase shift layer pattern to be within a process tolerance of the target CD, and in some situations the fabricated mask may be unusable and may need to be discarded.

Even when the CD just after the dry etch process or patterning process for forming the phase shift layer pattern is measured to be within the process tolerance of the target CD, the phase shift layer pattern can be excessively corroded or lost during the subsequent cleaning process. As a size of the phase shift layer pattern becomes finer, there occurs a case that the CD variation due to the loss phenomenon is out of a process tolerance. Observation has been reported that this excessive corrosion can be generated when using a cleaning solution having relatively high detergency, and this becomes a factor that restricts realization of a desired cleaning effect in the subsequent cleaning process. Since the cleaning process is a process of removing from the surface of the mask the byproducts or foreign substances generated during the fabrication of the mask, foreign substances or particles can remain on the surface of the mask when a cleaning process is performed using a cleaning solution having relatively weak detergency. This can result in an exposure defect generating in an exposure process for the pattern transfer. Therefore, in order to control the CD size of the phase shift layer pattern so that it is within a process tolerance of the target CD, development of a method capable of preventing or limiting the CD variation of the phase shift layer pattern caused during the cleaning process is needed.

SUMMARY OF THE INVENTION

In one embodiment of the disclosure, a method for fabricating a mask includes: sequentially depositing a phase shift layer and a light shielding layer on a transparent substrate; forming a light shielding layer pattern and a phase shift layer pattern by selectively etching the light shielding layer and the phase shift layer; forming protecting side walls which cover and protect side faces of the phase shift layer pattern; cleaning the substrate formed with the protecting side walls; and selectively removing a portion of the light shielding layer.

In another embodiment of the disclosure, a method for fabricating a mask includes: sequentially depositing a phase shift layer and a light shielding layer on a transparent substrate; forming a light shielding layer pattern and a phase shift layer pattern by selectively etching the light shielding layer and the phase shift layer; forming oxide side walls by oxidizing side faces of the phase shift layer pattern; cleaning the substrate formed with the oxide side walls; and selectively removing a portion of the light shielding layer.

Preferably, the phase shift layer comprises an alloy layer containing molybdenum (Mo) and silicon (Si), and the light shielding layer comprises a chromium (Cr) layer.

Preferably, the oxide side walls are formed of oxide containing molybdenum (Mo), silicon (Si), and oxygen (O) by the oxidation of the alloy layer containing molybdenum (Mo) and silicon (Si).

Preferably, forming the light shielding layer pattern and the phase shift layer pattern includes: firstly dry etching the light shielding layer using an etch gas containing chlorine ($Cl_2$) gas and oxygen ($O_2$) gas; and secondly dry etching the phase shift layer using an etch gas including sulfur hexafluoride ($SF_6$) gas and oxygen ($O_2$) gas.

Preferably, the phase shift layer pattern is formed by the second dry etch so as to have a narrower CD than the light shielding layer pattern. Preferably, forming the oxide side walls includes: oxidizing the side faces of the phase shift layer pattern with oxygen ($O_2$) plasma.

Cleaning the substrate can include, for example, using a cleaning solution containing sulfuric acid ($H_2SO_4$), hydrogen peroxide ($H_2O_2$), and water ($H_2O$).

Alternatively, cleaning the substrate can include, for example, using a cleaning solution containing ammonium ($NH_4OH$), hydrogen peroxide ($H_2O_2$), and water ($H_2O$).

In another embodiment of the disclosure, a method for fabricating a mask includes: sequentially depositing a phase shift layer and a light shielding layer on a transparent substrate; forming a light shielding layer pattern and a phase shift layer pattern by selectively etching the light shielding layer and the phase shift layer; forming a polymer layer which absorbs contaminants generated in forming the light shielding layer pattern and the phase shift layer pattern; cleaning the substrate so that the polymer layer is removed; selectively removing a portion of the light shielding layer; and forming oxide side walls on side faces of the phase shift layer pattern by selectively oxidizing the side faces of the phase shift layer pattern when a CD of the phase shift layer pattern is estimated to be smaller than a target CD.

In further another embodiment, a method for fabricating a mask includes: sequentially depositing a phase shift layer and a light shielding layer on a transparent substrate; forming a light shielding layer pattern and a phase shift layer pattern by selectively etching the light shielding layer and the phase shift layer; measuring a CD of the phase shift layer pattern and determining whether the CD of the phase shift layer pattern is within a process tolerance of a target CD; forming correction side walls to side faces of the phase shift layer pattern when the CD of the phase shift layer pattern is determined to be smaller than the target CD; selectively removing a portion of the light shielding layer pattern.

In yet another embodiment, a mask includes: a phase shift layer pattern formed on a transparent substrate; and correction side walls attached to side faces of the phase shift layer pattern when a CD of the phase shift layer pattern is smaller than a target CD.

DESCRIPTION OF SPECIFIC EMBODIMENTS

Embodiments of the present disclosure are directed to a process of oxidizing a side wall of a mask pattern to ensure a larger CD of the mask pattern so that the CD of the mask pattern is within a process tolerance of a target CD when fabricating the mask. The mask can be, for example, a halftone phase shift mask used in photolithography technology.

A phase shift layer pattern is formed as a mask pattern by selective dry etch, and then whether a profile of the pattern is to be changed to a smaller size as a final CD of the phase shift layer pattern gets out of the target CD is determined through a CD measurement. When the determination is made that the measured CD is within a process tolerance of the target CD but the profile of the pattern is to be changed to a smaller size than the target CD in a subsequent cleaning process, a process of oxidizing a side wall of the mask pattern is performed prior to the cleaning process in order to prevent or limit variation of the final CD of the mask after the cleaning process outside of the allowed process tolerance.

The formed oxide layer prevents excessive loss of the mask pattern in a lateral direction in which the CD would be reduced, and compensates for this CD reduction. Therefore, the CD of the final mask pattern after the cleaning can be maintained in a CD which is within the process tolerance of the target CD in spite of the CD loss caused by the cleaning process. Since it is possible to restrict and compensate the CD loss of the mask pattern in the cleaning process, it is possible to use a cleaning solution, which can cause relatively excessive loss of the mask pattern. For example, it is possible to introduce a sulfuric based cleaning solution such as Sulfuric acid Peroxide Mixture (SPM), which has a superior detergency to organic matters or metal particles, as well as an ammonia based cleaning solution such as Ammonium Peroxide Mixture (APM) in order to effectively remove the foreign substances such as byproducts, particles, and organic matter, generated during patterning of the mask pattern, and effectively prevent generation of defects by contaminants or foreign substances.

FIGS. 1 through 10 are cross-sectional views illustrating a process of fabricating a mask in accordance with an embodiment of the present disclosure.

Figure 1:
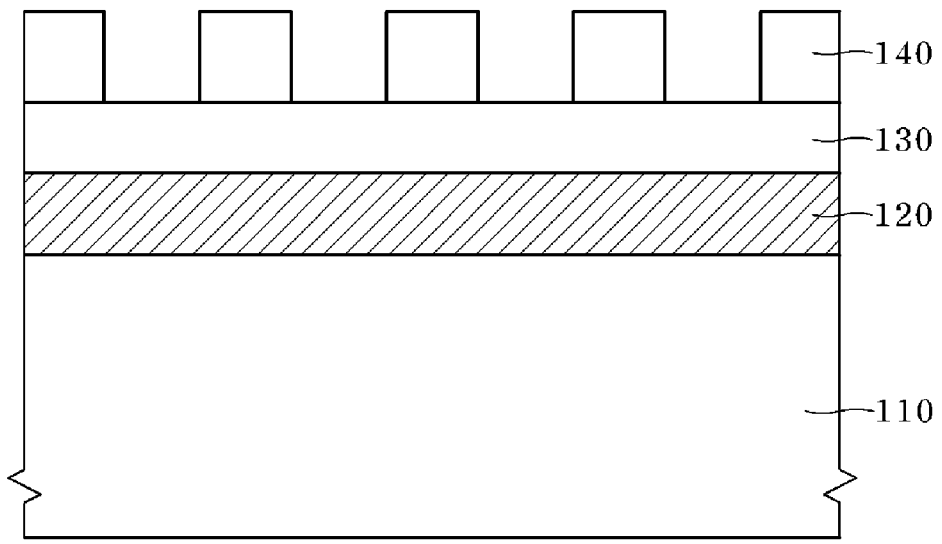
FIGS. 1 through 6 are cross-sectional views illustrating a method for fabricating a mask in accordance with an embodiment of the present disclosure, in which an oxide side wall is introduced.

Referring to FIG. 1, a method for fabricating a mask in accordance with an embodiment of the present disclosure is performed in a phase shift mask (PSM) fabrication method in order to expose and transfer a pattern with a finer CD size onto a wafer. A phase shift layer 120 and a light shielding layer 130 are sequentially deposited on a transparent substrate 110 such as, for example, a quartz substrate. The phase shift layer 120 can comprise, for example, a MoSi alloy layer, which includes molybdenum (Mo) and silicon (Si). The MoSi alloy layer can further contain, for example, oxygen (O), nitrogen (N), and combinations thereof. A chromium (Cr) layer, for example, can be deposited as the light shielding layer 130 on the phase shift layer 120. In the PSM, the phase shift layer 120 is patterned to form a mask pattern, which can have the pattern of a circuit pattern to be subsequently transferred onto a wafer, while the chromium layer, for example, remains as a light shielding layer pattern in a frame region in an edge of the PSM.

A resist layer (not shown) is applied on the light shielding layer 130 and can be patterned to form a resist pattern 140, using, for example, an electron beam exposure process and a development process performed after the electron beam exposure. The resist pattern 140 is formed as an etch mask on the light shielding layer 130. The resist pattern 140 is formed having the layout of a mask pattern to be formed. The light shielding layer 130 and the phase shift layer 120 are patterned using the resist pattern 140 to have a CD in accordance with the CD of the resist pattern 140 by a subsequent selective etch process.

Figure 2:
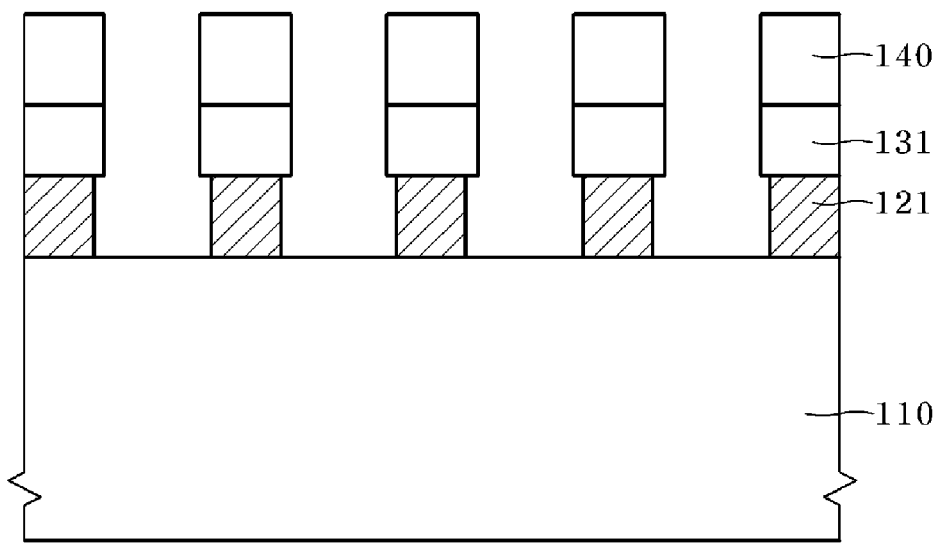

Referring to FIG. 2, the portion of the light shielding layer 130 exposed by the resist pattern 140 is selectively etched to form a light shielding layer pattern 131, and then the portion of the phase shift layer 120 subsequently exposed is selectively etched to form a phase shift layer pattern 121. This selective etch process can be performed, for example, as a dry etch process using, for example, a plasma etch. For example, the light shielding layer pattern 131 can be formed by first dry etching the light shielding layer 130 using, for example, an etch gas, which includes, for example, chlorine ($Cl_2$) gas and oxygen ($O_2$) gas. The phase shift layer pattern 121 can then be formed, for example, by dry etching the exposed portion of the phase shift layer 120 using, for example, an etch gas, which includes, for example, sulfur hexafluoride ($SF_6$) gas and oxygen ($O_2$) gas. An etch selectivity in a plasma etch process can be different between the light shielding layer 130, for example, when formed of a chromium layer, and the phase shift layer 120, for example, when formed of a molybdenum-silicon alloy layer, which can result in the phase shift layer pattern 121 being recessed more inwardly as compared to the light shielding layer 131 to form a profile having relatively narrow CD as compared to the CD of the light shielding layer pattern 131. This side wall profile can be confirmed, for example, by transmission electron microscopy (TEM).

Figure 3:
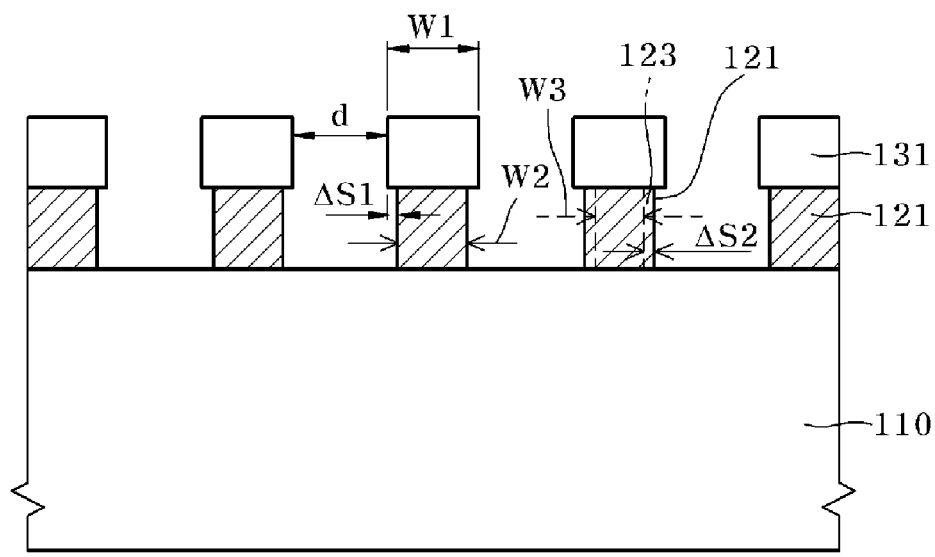

Referring to FIG. 3, the phase shift layer pattern 121 and the light shielding layer pattern 131 are patterned and the resist pattern 140 is then selectively removed. The resist pattern 140 can be selectively removed, for example, by cleaning the resulting product using a cleaning solution, which includes, for example, DeIonized water (DI water) and ozone ($O_3$).

A first CD (W1) and a spacing gap (d) of the light shielding layer pattern 131 are measured after removal of the resist pattern 140. The CD measuring process can be performed, for example, using a Scanning Electron Microscope (SEM). Since the light shielding layer pattern 131 is aligned on the phase shift layer pattern 121, the measured CD is actually obtained with respect to the first CD (W1) and the spacing gap (d). In the PSM mask, since the phase shift layer pattern 121 is actually transferred as a mask pattern onto the wafer and influences the CD of the photoresist pattern on the wafer, a second CD (W2) of the phase shift layer pattern 121 is estimated from the measured first CD (W1).

The phase shift layer pattern 121 is recessed more inwardly as compared to the light shielding layer pattern 131 during the etch process performed to pattern the layers. A first difference ($\Delta S1$) between the second CD (W2) of the phase shift layer pattern 121 and the first CD (W1) of the light shielding layer pattern 131 depends on the variation in width between the light shielding layer pattern 131 and the phase shift layer pattern 121 caused in this etch process. Therefore, by patterning test light shielding layer patterns and test phase shift layer patterns having various CD sizes and then preferentially measuring the CDs of these test light shielding layer patterns and test phase shift layer patterns to ensure the measured data, it is possible to estimate the first difference ($\Delta S1$) generated with respect to the first CD (W1) of the light shielding layer pattern 131 and estimate the second CCD (W2) from the first difference ($\Delta S1$) and the measured first CD (W1).

Even when the estimated second CD (W2) of the phase shift layer pattern 121 primarily is within the process tolerance of with the target CD, it can be estimated that a resulting third CD (W3) of the phase shift layer pattern 123 after a cleaning process is performed will not be within the process tolerance of the target CD due to a decrease of the width resulting from the cleaning process. The third CD (W3) can be outside the process tolerance of the target CD when the actually estimated second CD (W2) is within the process tolerance of the target CD. When the phase shift layer pattern 121 is exposed to the subsequent cleaning process, the exposed portion can be etched or corroded by the etch solution used in the cleaning process and thus can be lost. The CD variation resulting from the loss of the phase shift layer pattern 121 during this cleaning process can be estimated as a second difference ($\Delta S2$). In this case, the resulting third CD (W3) of the phase shift layer pattern 123 after the cleaning process becomes quite small, which can cause a CD defect in the photoresist pattern (or wafer pattern) formed on the wafer, the CD of which is determined by the CD of the phase shift layer pattern 123. Accordingly, the CD of the photoresist pattern (or water pattern) could have a CD size smaller than the target CD size.

When determining the defect of the second CD (W2) of the phase shift layer pattern 121 after the etch taking in consideration the first difference ($\Delta S1$) and the second difference ($\Delta S2$) of the CDs, the process margin is much narrowed and the process defect is thus considerably increased. The methods in accordance with embodiments of the present disclosure are capable of preventing or limiting the generation of the second difference ($\Delta S2$) of the CD during the subsequent cleaning process or compensating for the second difference ($\Delta S2$).

Figure 4:
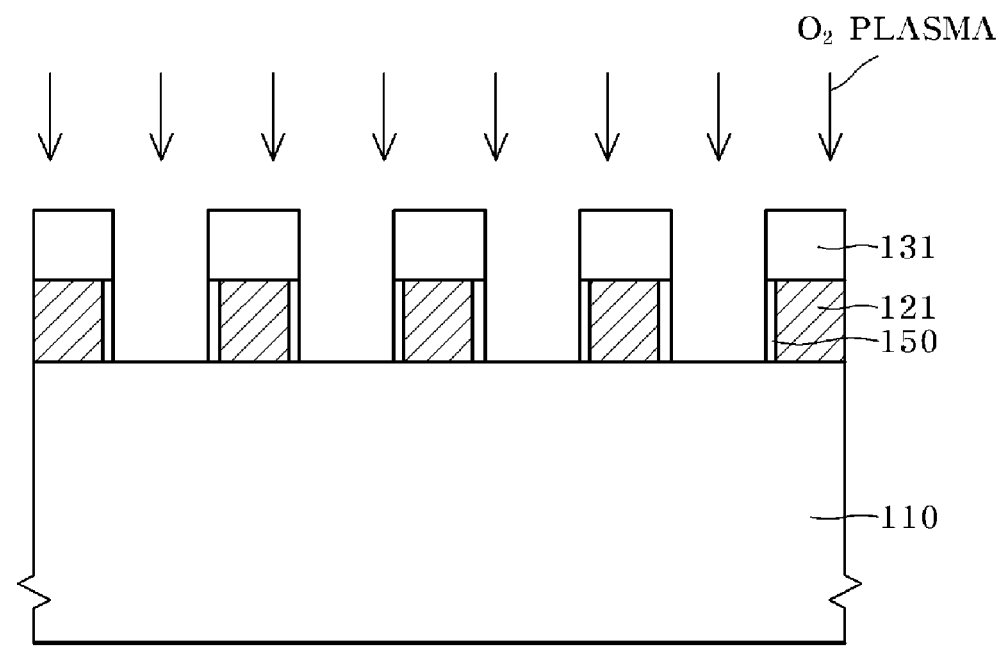

Referring to FIG. 4, when the second CD (W2) of the phase shift layer pattern 121 has a small CD size which is not within the process tolerance of the target CD, or the final third CD (W3) is estimated to have a smaller CD size than the target CD after the subsequent cleaning process a process of oxidizing side faces of the phase shift layer pattern 121 to form oxide side walls 150 as protecting side walls on the side face can be performed prior to the cleaning process. When the second CD (W2) is within the process tolerance of with the target CD or has a CD size larger than the target CD even in consideration of the amount of the phase shift layer patterns in the subsequent cleaning process, it is possible to omit the process of forming the oxide side walls 150 as a protecting side wall.

Oxygen plasma ($O_2$), for example, can be provided onto the transparent substrate 110 formed with the phase shift layer pattern 121 and the light shielding layer pattern 131 to oxidize the exposed side walls of the phase shift layer pattern 121. The oxide side walls 150 are formed on the side faces of the phase shift layer pattern 121 by this oxidation process. Oxygen gas and argon gas (Ar), for example, can be provided onto the substrate 110 to grow a layer of oxide such as, for example, MoSiO from the exposed side surfaces of the phase shift layer pattern 121. When the MoSi layer of the phase shift layer pattern 121 contains oxygen or nitrogen, the oxide side walls 150 are grown having MoSiON component. The oxygen plasma also oxidizes a surface of the light shielding layer pattern 131 to grow an oxide layer thereon, but the light shielding layer pattern 131 is removed in the subsequent process and thus the oxide layer grown on the surface of the light shielding layer pattern 131 is removed together with the removal of the light shielding layer pattern 131. Since the portion of the substrate 110 adjacent to the phase shift layer pattern 121 and thus exposed is a quartz substrate of silicon oxide ($SiO_2$), the oxide layer is not meaningfully grown on the substrate 110.

The oxide side walls 150 grown on the side faces of the phase shift layer pattern 121 induce, since they are grown by oxidation of the material, for example, MoSi, of the phase shift layer pattern 121, an effect similar to expansion of the CD of the phase shift layer pattern 121. That is to say, the oxide side walls 150 prevent the side faces of the phase shift layer pattern 121 from being exposed and thus limits or prevents loss of the phase shift layer pattern 121 in the subsequent cleaning process. Therefore, it is possible to limit or prevent a decrease of the width of the phase shift layer pattern 121 during the subsequent cleaning process, and, thus, prevent or limit the undesirable reduction in the CD thereof.

To this end, the oxide side walls 150 are formed having a width, for example, of about 30 Å to about 50 Å, which is larger than an estimated loss of the width phase shift layer pattern during the subsequent cleaning process. The phase shift layer pattern 121 can be formed, for example, with a CD of about 130 nm to about 150 nm in the case that it is a gate of a transistor with a fine CD of 30 to 40 nm, and the lost thickness by the etch function of the cleaning solution upon the cleaning is observed to be about 10 Å to about 20 Å. In consideration of the lost thickness (or width), the oxide side walls 150 are formed to a sufficient width to prevent the side faces of the phase shift layer pattern 121 from being exposed during the cleaning process. Since the width of the oxide side walls 150 depends on an oxidation growth rate and a process time of the plasma oxidation process, it is possible to grow the oxide side walls 150 to a desired thickness by controlling the oxidation growth rate and the process time of the plasma oxidation process.

The oxide side walls 150 can prevent loss of the phase shift layer pattern 121 in the cleaning process and thus the phase shift layer pattern 121 can be maintained so that its CD is within the process tolerance of with the target CD. Also the oxide side walls 150 can function to enlarge and correct the CD of the phase shift layer pattern 121. Since the oxide side walls 150 are formed of a material which is grown from the phase shift layer pattern 121 material, when the phase shift layer pattern 121 is formed of a material containing oxygen and nitrogen together with MoSi, the oxide side walls 150 can also be formed of a material of MoSiO further added with an oxygen component. Therefore, the oxide side walls 150 can remain after the cleaning process to induce an effect that the CD of the phase shift layer pattern 121 is enlarged. Using this, when the CD of the phase shift layer pattern 121 is smaller than the target CD, it is possible to obtain a CD correction effect in which the CD of the phase shift layer pattern 121 is enlarged so as to be within the process tolerance of the target CD.

Figure 5:
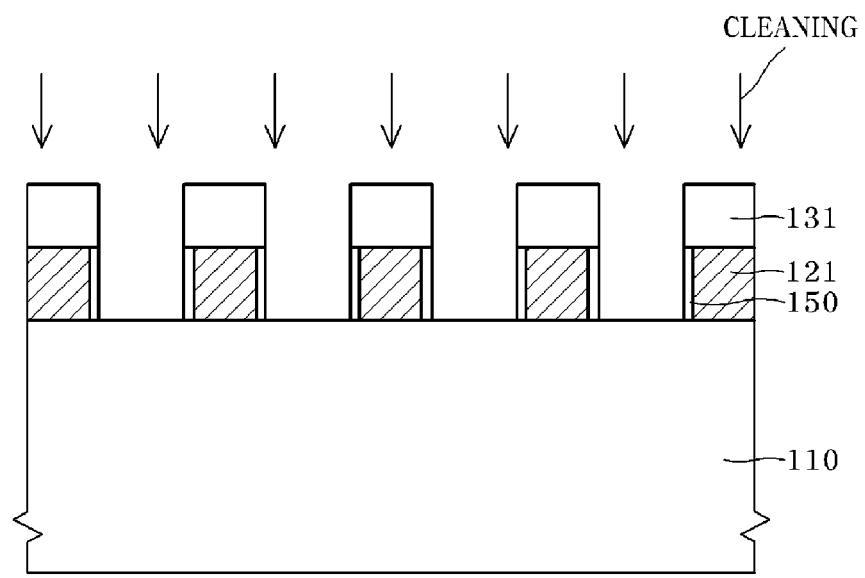

Referring to FIG. 5, the substrate 110 formed with the oxide side walls 150 is cleaned to remove organic contaminants, defect sources, and/or residues generated in the previous process. The residues or particles such as, for example, etch byproducts generated during the previous dry etch process can cause pattern defects on the wafer upon exposure using the mask. Therefore, the cleaning process is performed to remove the contaminants or defect sources.

A cleaning solution containing sulfuric acid ($H_2SO_4$), hydrogen peroxide ($H_2O_2$), and water ($H_2O$), for example, Sulfuric acid Peroxide Mixture (SPM), can be used in the cleaning process. The SPM is effective for the removal of metal particles and removal of organic contaminants. The cleaning process can also be performed, for example, using a cleaning solution containing ammonium ($NH_4OH$), hydrogen peroxide ($H_2O_2$), and water ($H_2O$), for example, Ammonium Peroxide Mixture (APM), but the SPM is evaluated to have superior cleaning effect as ability of removing foreign substances of the SPM is observed to be relatively higher than that of the APM.

Superior cleaning effect can be expected when using the SPM, but the SPM results in increased metal corrosion due to sulfuric acid contained in the SPM. When the side faces of the phase shift layer pattern 121 are exposed to the SPM cleaning solution, a portion of the phase shift layer pattern 121 is lost and the CD of the phase shift layer pattern 121 is reduced by the corrosion action of the SPM cleaning solution. Thus a defect can occur in which the CD of the phase shift layer pattern 121 becomes considerably smaller than the target CD. The oxide side walls 150 formed on the side faces of the phase shift layer pattern 121 can prevent the phase shift layer pattern 121 from being in contact with the cleaning solution, and, thus, can prevent or limit the decrease in CD of the phase shift layer pattern 121 due to the cleaning solution. The decrease in CD caused by the cleaning solution can be experimentally measured and it is possible to prevent the loss of any portion of the phase shift layer pattern 121 by forming the oxide side walls 150 with a width larger than the experimentally measured CD decrease.

Since it is possible to protect the phase shift layer pattern 121 with the oxide side walls 150, it is possible to use the SPM cleaning solution, having relatively superior detergency to the organic foreign substances, in the cleaning process. Also, it is possible to perform the cleaning by dip cleaning, in which cleaning is performed by dipping the substrate 110 into the cleaning solution. It is possible to more completely remove the defect or foreign contaminants, which can remain on the surface, using the dip cleaning method, and, thus, it possible to effectively reduce the defect sources, such as residues, generated in the previous etch process.

Figure 6:
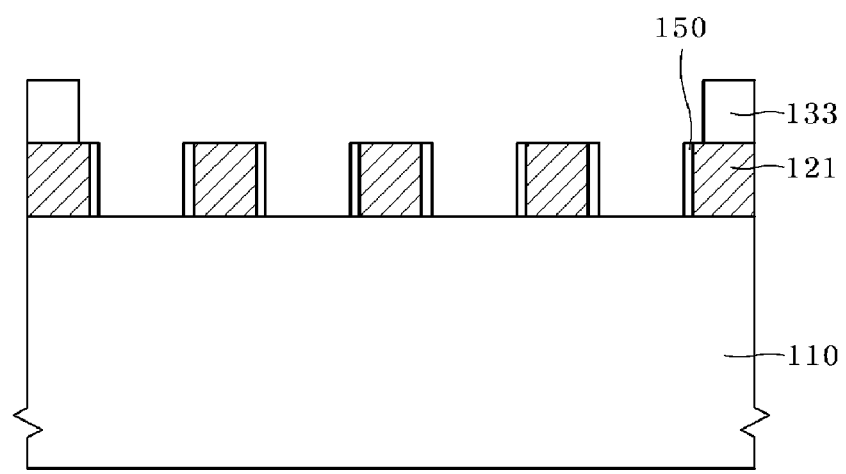

Referring to FIG. 6, the light shielding layer pattern (131 of FIG. 5) on the phase shift layer pattern 121 is partially removed after the cleaning process. A portion of light shielding layer pattern 133 remains in the frame region at the edge of the substrate 110. The phase shift layer pattern 121 formed as described above can maintain the CD which is within the process tolerance of the target CD since corrosion and resulting loss of the phase shift layer pattern 121 in the cleaning process after the etch process is prevented or limited by the oxide side walls 150. Also, since it is possible to perform the cleaning process using sulfuric acid with superior detergency without a significant decrease in the CD of phase shift layer pattern 121, it is possible to largely reduce the defect sources or contaminants remaining on the surface of the substrate 110.

In order to further limit the cleaning process's effect on the CD of the phase shift layer pattern 121, and more effectively remove the foreign substances or the defect sources, a polymer layer 160 can be deposited on the substrate 110 having the oxide side walls 150.

Figure 7:
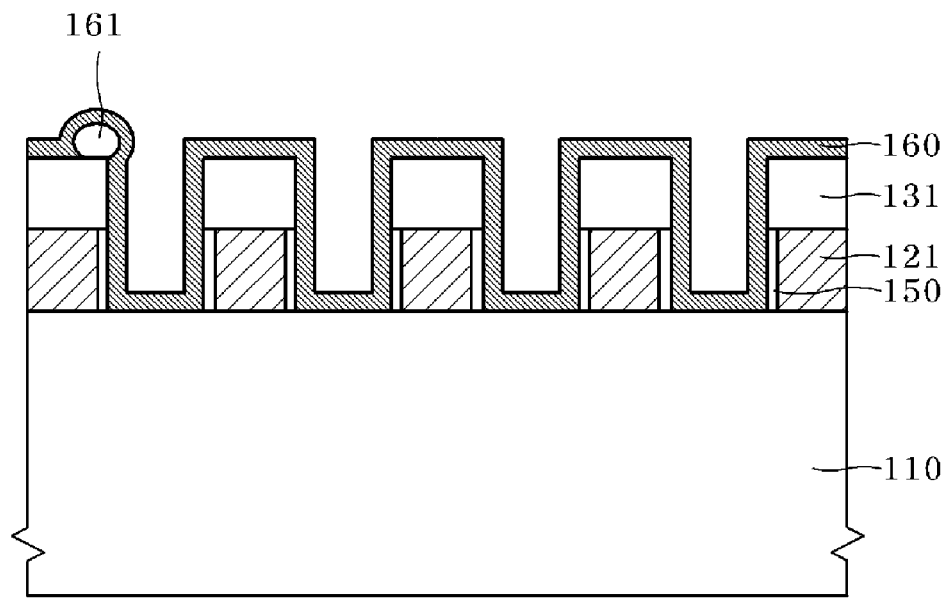
FIGS. 7 and 8 are cross-sectional views illustrating a method for fabricating a mask in accordance with another embodiment of the present disclosure, in which deposition of a polymer layer is introduced.

Referring to FIG. 7, after the process of forming the oxide side walls 150 is performed as shown in FIG. 4, a process of forming a polymer layer 160, which extends to cover the exposed portion of the substrate 110, the light shielding layer pattern 131, and the oxide side walls 150, is performed. Etch byproducts, particles, or organic contaminants generated in the etch process of patterning the phase shift layer pattern 121 and the light shielding layer pattern 131 can remain as defect sources or contaminants 161 on the substrate 110.

Figure 8:
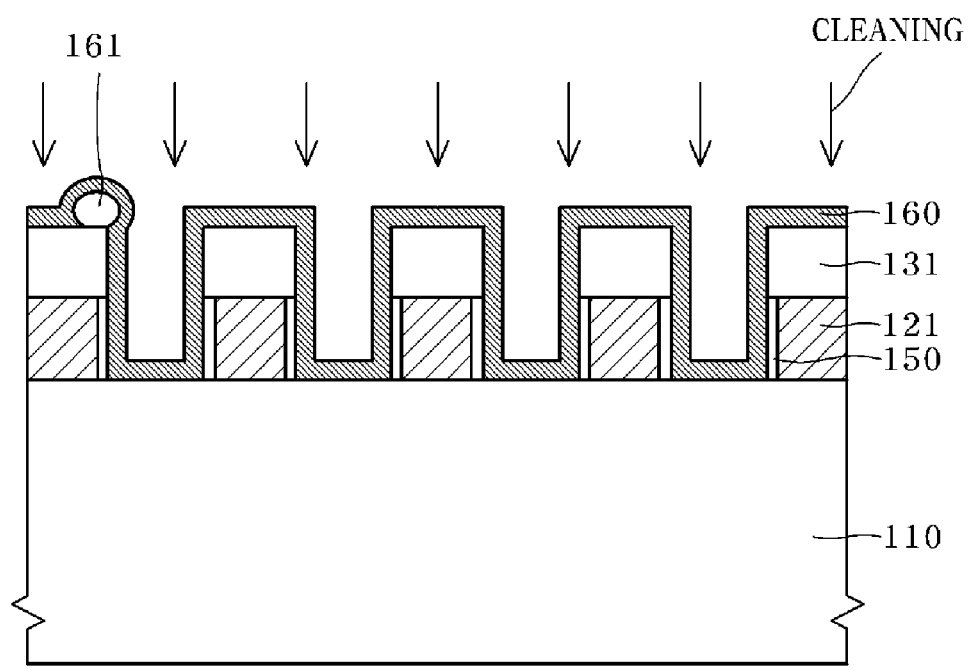

Since the contaminants 161 can cause a pattern transfer defects upon exposure, it should be removed by a cleaning process upon fabrication of a mask. The deposited polymer layer 160 absorbs the remaining contaminants 161 and the absorbed contaminants 161 are removed together with removal of the polymer layer 160 during the cleaning process, as shown in FIG. 8. The polymer layer 160 can result in more effective removal of the contaminants 161 by absorption of the contaminants 161, and can thereby improve detergency of the cleaning process. Also, the polymer layer 160 functions as an additional buffer layer, which can prevent the phase shift layer pattern 121 from being corroded by the cleaning solution. By primarily protecting the phase shift layer pattern 121 with the oxide side walls 150 and secondarily protecting the phase shift layer pattern 121 with the polymer layer 160, it is possible to more effectively prevent or limit the decrease in CD of the phase shift layer pattern 121 upon cleaning.

Deposition of the polymer layer 160 can be done, for example, by performing plasma deposition on the substrate 110 using, for example, a fluorocarbon (CF) based gas or fluorinated hydrocarbon (CHF) based gas. For example, gases such as difluoromethane ($CH_2F_2$), octafluorobuthene ($C_4F_8$) and hexafluorobutyne ($C_4F_6$), and oxygen gas and argon gas are plasma exited and this plasma is provided onto the substrate 110, thereby forming the polymer layer 160 on the substrate 110. The polymer layer 160 can be deposited to a thickness of tens to hundreds of angstroms, for example, approximately 500 Å.

By introducing this polymer layer 160, it is possible to more effectively protect the phase shift layer pattern 121 from corrosion and loss when performing the cleaning process using the SPM cleaning solution containing sulfuric acid with superior detergency, as shown in FIG. 8. Therefore, it is possible to prevent or limit a decrease in the CD of the phase shift layer pattern 121, while increasing the cleaning effect.

Figure 9:
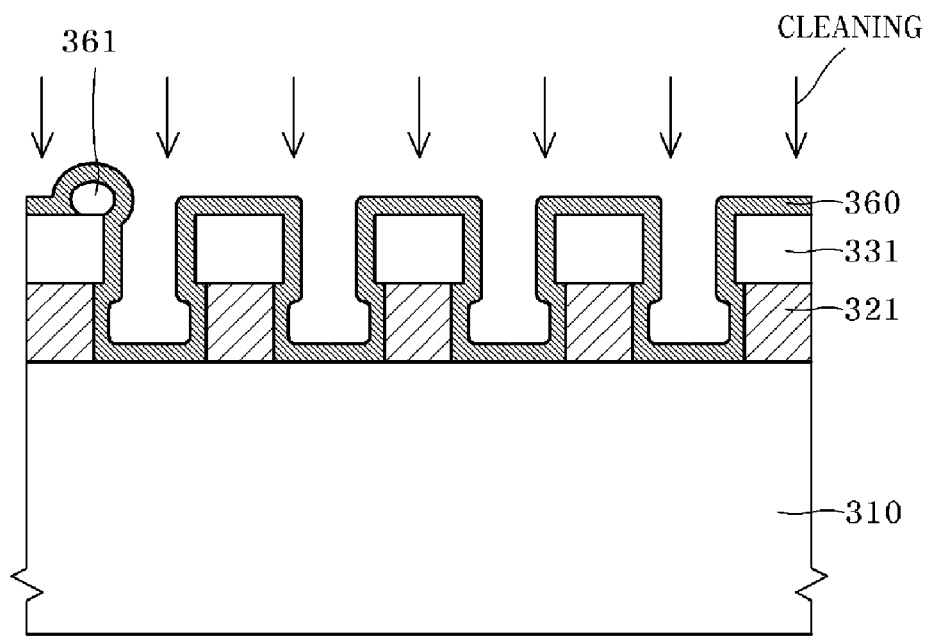
FIGS. 9 and 10 are cross-sectional views illustrating a method for fabricating a mask in accordance with another embodiment of the present disclosure, in which deposition of a polymer layer is introduced.

Referring again to FIG. 3, when the second CD (W2) of the phase shift layer pattern 121 is within a process tolerance of the target CD or has a CD size larger than the target CD even in consideration of the decrease in CD resulting from the subsequent cleaning process, it is possible to omit the process of forming the oxide side walls (150 of FIG. 4). In this case, the process of forming the oxide side walls 150 is omitted, and a polymer layer 360, which covers the phase shift layer pattern 321 and the light shielding layer 331 patterned on the transparent substrate 310, is directly deposited, as shown in FIG. 9. The deposition of this polymer layer 360, as described with reference to FIGS. 7 and 8, can allow for more effective removal of the contaminants (161 of FIG. 7) and can prevent or limit a decrease in CD of the phase shift layer pattern 321 during the cleaning process and removal of the polymer layer 360.

Figure 10:
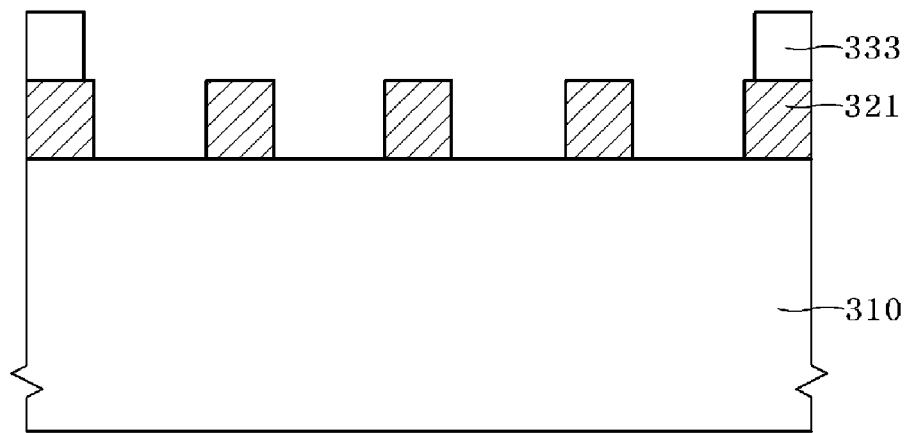

As shown in FIG. 9, the polymer layer 360 is deposited and then a cleaning process is performed to remove the polymer layer 360, and thereby remove the contaminants 361. Since the polymer layer 360 can protect the phase shift layer pattern 321 and thus prevent or limit the corrosion loss caused by the cleaning solution, it is possible to use a cleaning solution such as sulfuric acid, which is capable of corroding the phase shift layer pattern 321, in the cleaning process. Since it is possible to use a cleaning solution such as the SPM containing the sulfuric acid, it is possible to more effectively remove the contaminants 361 formed on the substrate 310 and thus prevent generation of defects due to the contaminants 361. After the cleaning process is performed, as shown in FIG. 10, a portion of the light shielding layer pattern 331 is removed and the phase shift layer pattern 321 is exposed. A portion of the light shielding layer pattern 333 remains in the frame region of the substrate 310. Since the corrosion loss on the phase shift layer pattern 321 is prevented or limited during the cleaning, the resulting phase shift layer pattern 321 can have a CD which within a process tolerance of the aimed target CD.

An embodiment of the present disclosure is directed to a method of correcting the CD of the phase shift layer pattern.

Figure 11:
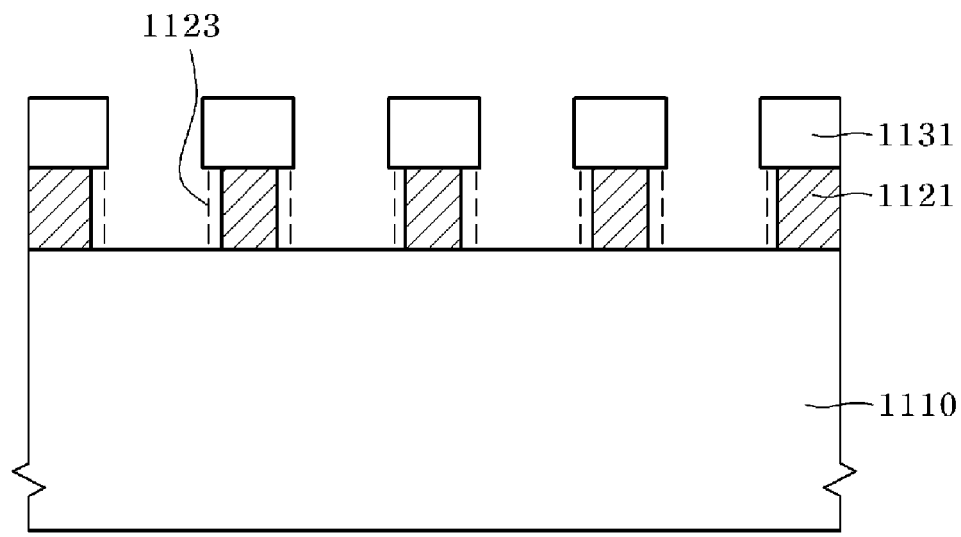
FIGS. 11 and 13 are cross-sectional views illustrating a method for fabricating a mask in accordance with another embodiment of the present disclosure, in which CD correction is introduced.

Referring to FIG. 11, the phase shift layer pattern 1121 and the light shielding layer pattern 1131 are formed on the transparent substrate 1110 in the same manner as described with reference to FIGS. 1 and 2. After that, a CD measuring process is performed to measure or estimate the CD of the phase shift layer pattern 1121 as described with reference to FIG. 3. When the CD of the phase shift layer pattern 1121 is not within a process tolerance of the target CD 1123, and, particularly, when the CD of the phase shift layer pattern 1121 is measured to be smaller than the target CD 1123, a CD correction process is performed to enlarge the CD of the phase shift layer pattern 1121.

Figure 12:
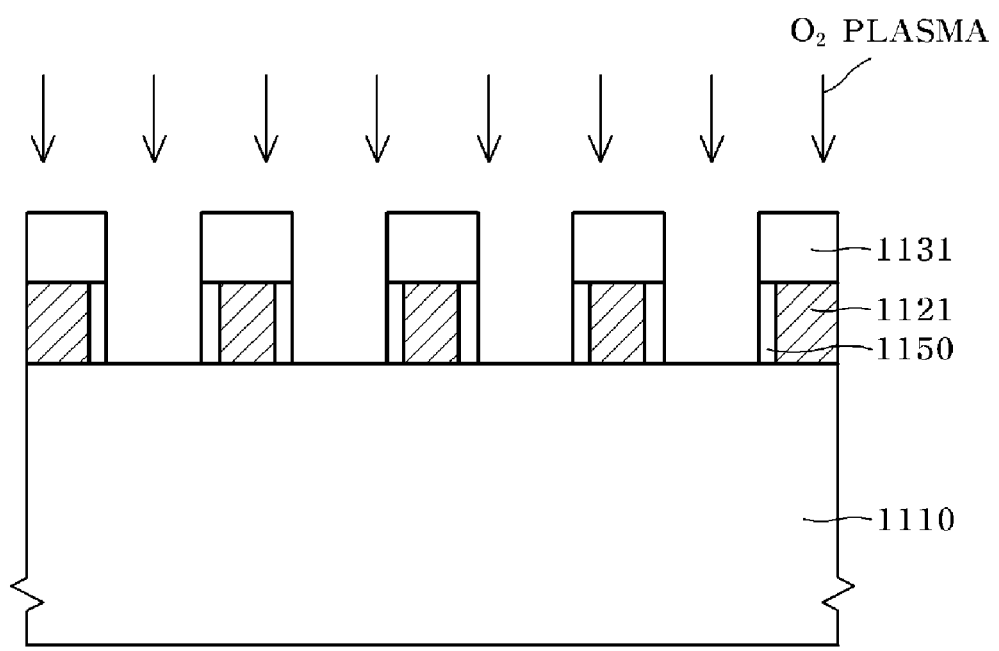

For this CD correction, as shown in FIG. 12, correction side walls 1150 for enlarging and correcting the CD is formed on the side faces of the phase shift layer pattern 1121. Since the phase shift layer pattern 1121 functions to change the phase of the light incident in the exposure process, the correction side walls 1150 are formed having an equal thickness to the phase shift layer pattern 1121 so as to induce the same phase shift as the phase shift layer pattern 1121. Also, the correction side walls 1150 are formed so as to have the same transmissivity as the transmissivity of the phase shift layer pattern 1121. However, when the correction side walls 1150 are formed of a material different than the material of the phase shift layer pattern 1121, it is difficult to ensure that the correction side walls 1150 have the same phase shifting ability and transmissivity as the phase shift layer pattern 1121.

In an embodiment of the present disclosure, oxygen ($O_2$) plasma or ozone ($O_3$) plasma is provided to the exposed side faces of the phase shift layer pattern 1121 to induce the growth of the correction side walls 1150. When the phase shift layer pattern 1121 is formed, for example, of an alloy layer containing molybdenum (Mo) and silicon (Si), the correction side walls 1150 are grown to form an oxide containing molybdenum (Mo), silicon (Si), and oxygen (O) by oxidation of the alloy layer containing molybdenum (Mo) and silicon (Si). Since the correction side walls 1150 are formed by this oxidation growth, the correction side walls 1150 are grown to have the same thickness as the phase shift layer pattern 1121 and have the same phase shift ability since the composition thereof is substantially the same as the composition of the phase shift layer pattern 1121, except for the addition of oxygen. Therefore, the correction side walls 1150 can enlarge the CD of the phase shift layer pattern 1121 so that the CD of the phase shift layer pattern 1121 is within the process tolerance of the target CD (1123 of FIG. 11). After the correction side walls 1150 are formed, a cleaning process can be performed by a cleaning method as described with reference to FIG. 5 and FIGS. 7 to 9.

Figure 13:
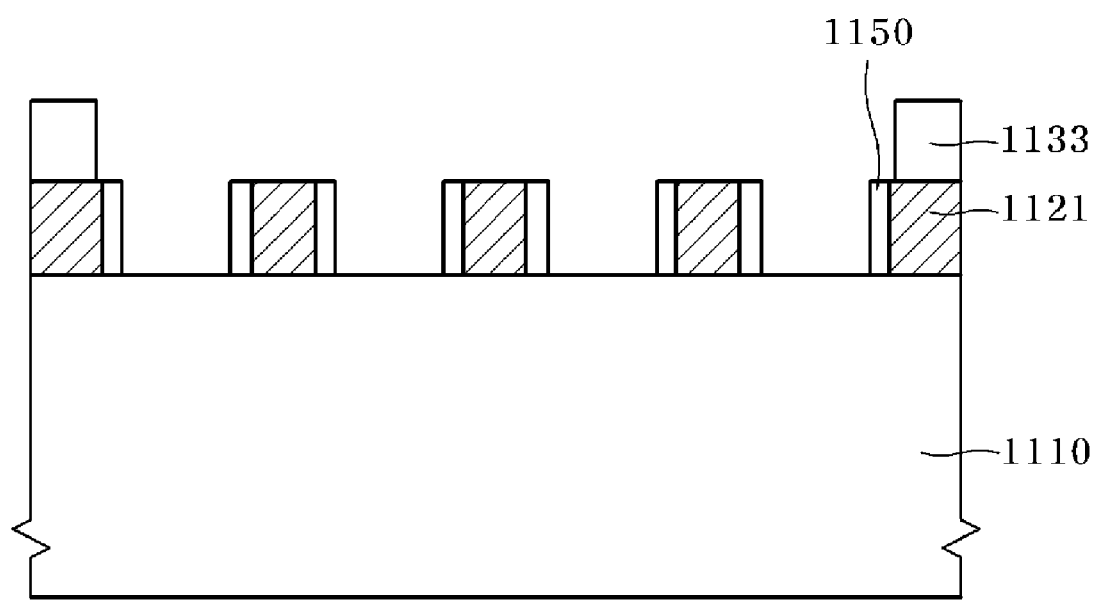

Referring to FIG. 13, a portion of the light shielding layer pattern (1131 in FIG. 12) is selectively removed such that only a portion of the light shielding layer pattern 1133 in the frame region of the substrate remains. Therefore, by introducing the correction side walls 1150 on the phase shift layer pattern 1121 having a CD narrower than the target CD, it is possible to enlarge and correct the CD of the phase shift layer pattern 1121. Therefore, even in the case of a CD defect in which a narrower CD is measured as compared to the target CD, it is possible to restore the CD to be within the process tolerance of the target CD through the CD correction process rather than discard the mask itself having the CD defect.

In accordance with an embodiment of the present disclosure as described above, it is possible to more effectively remove the contaminants which can cause defects with the cleaning solution containing sulfuric acid, while controlling the CD of the phase shift layer pattern 121 so as to remain within the process tolerance of the target CD. The corrosion loss of the phase shift layer pattern 121 resulting from the sulfuric acid cleaning can be effectively prevented or limited by the oxide side walls 150 and the polymer layer 160, and thus the CD of the phase shift layer pattern 121 can be maintained. As is apparent from the above description, embodiments of the present disclosure can be applied to correct the CD of the pattern in a process in which a CD margin of the phase shift layer pattern 121 is extremely narrow, or effectively reduce the CD variation in the corrected pattern. Also, it is possible to correct the CD of the phase shift layer pattern 121 of which CD is formed narrow so that the CD is effectively expanded.

While the present invention has been described with respect to the specific embodiments, it will be apparent to those skilled in the art that various changes and modifications may be made without departing from the spirit and scope of the invention as defined in the following claims.

What is claimed is:
1. A method for fabricating a mask, comprising:
depositing a phase shift layer on a transparent substrate;
depositing a light shielding layer on the phase shift layer;
forming a light shielding layer pattern and a phase shift layer pattern by selectively etching the light shielding layer and the phase shift layer;

forming protecting side walls which cover side surfaces of the phase shift layer pattern;

cleaning the substrate, wherein the protecting side walls protect the phase shift layer pattern from being damaged; and selectively removing at least a portion of the light shielding layer pattern.

2. The method of claim 1, where forming the protecting side walls comprises oxidizing the side surfaces of the phase shift layer pattern using an oxidizing agent comprising oxygen ($O_2$) plasma or ozone ($O_3$) plasma.

3. The method of claim 2, wherein the phase shift layer comprises an alloy layer comprising molybdenum (Mo) and silicon (Si), the light shielding layer comprises a chromium (Cr) layer, and the protecting side walls are formed of an oxide comprising molybdenum (Mo), silicon (Si), and oxygen (O) by oxidation of the phase shift layer pattern.

4. The method of claim 1, further comprising:

forming a polymer layer which covers the side walls and the light shielding layer pattern, wherein the polymer layer absorbs contaminants generated in forming the light shielding layer pattern and the phase shift layer pattern; and cleaning the substrate comprises removing the polymer layer.

5. A method for fabricating a mask, comprising:

depositing a phase shift layer on a transparent substrate;

depositing a light shielding layer on the phase shift layer;

forming a light shielding layer pattern and a phase shift layer pattern by selectively etching the light shielding layer and the phase shift layer;

forming oxide side walls by oxidizing side faces of the phase shift layer pattern;

cleaning the substrate formed with the oxide side walls; and selectively removing at least a portion of the light shielding layer pattern.

6. The method of claim 5, wherein the phase shift layer comprises an alloy layer comprising molybdenum (Mo) and silicon (Si), the light shielding layer comprises a chromium (Cr) layer, and the oxide side walls are formed of oxide comprising molybdenum (Mo), silicon (Si), and oxygen (O) by oxidation of the alloy layer containing molybdenum (Mo) and silicon (Si).

7. The method of claim 5, wherein forming the light shielding layer pattern and the phase shift layer pattern comprises:

dry etching the light shielding layer using an etch gas comprising chlorine ($Cl_2$) gas and oxygen ($O_2$) gas; and dry etching the phase shift layer using an etch gas comprising sulfur hexafluoride ($SF_6$) gas and oxygen ($O_2$) gas.

8. The method of claim 7, wherein the phase shift layer pattern is patterned by the second dry etch to have a narrower CD than the light shielding layer pattern.

9. The method of claim 5, wherein forming the oxide side walls comprises oxidizing the side faces of the phase shift layer pattern with oxygen ($O_2$) plasma or ozone ($O_3$) plasma.

10. The method of claim 5, wherein the oxide side walls are formed by oxidation growth to a width of about 30 Å to about 50 Å, which is larger than a width of the phase shift layer pattern expected to be lost upon cleaning, so as to protect the phase shift layer pattern during cleaning.

11. The method of claim 5, wherein the oxide side walls are formed by oxidation growth to a width of about 30 Å to about 50 Å, so that a CD of the phase shift layer pattern after cleaning the substrate agrees with a target CD.

12. The method of claim 5, further comprising, before cleaning the substrate, forming a polymer layer which covers the oxide side walls and the light shielding layer pattern, wherein the polymer layer absorbs contaminants generated and remaining after forming the light shielding layer pattern and the phase shift layer pattern, wherein cleaning the substrate comprises removing the polymer layer.

13. The method of claim 12, wherein the polymer layer is formed by deposition of a gas selected from the group consisting of difluoromethane ($CH_2F_2$), octafluorobuthene ($C_4F_8$), and hexafluorobutyne ($C_4F_6$), or a plasma of oxygen gas and argon gas onto the oxide side walls and the light shielding layer pattern.

14. The method of claim 5, wherein cleaning the substrate comprises using a cleaning solution comprising sulfuric acid ($H_2SO_4$), hydrogen peroxide ($H_2O_2$), and water ($H_2O$).

15. The method of claim 5, wherein cleaning the substrate comprises using a cleaning solution comprising ammonium ($NH_4OH$), hydrogen peroxide ($H_2O_2$), and water ($H_2O$).

16. A method for fabricating a mask, comprising:

A method for fabricating a mask, comprising:

depositing a phase shift layer on a transparent substrate;

depositing a light shielding layer on the phase shift layer;

forming a light shielding layer pattern and a phase shift layer pattern by selectively etching the light shielding layer and the phase shift layer;

forming oxide side walls by oxidizing side faces of the phase shift layer pattern;

forming a light shielding layer pattern and a phase shift layer pattern by selectively etching the light shielding layer and the phase shift layer;

forming a polymer layer which absorbs contaminants generated in forming the light shielding layer pattern and the phase shift layer pattern over the light shielding layer pattern and the phase shift layer pattern;

cleaning the substrate so that the polymer layer is removed;

selectively removing at least a portion of the light shielding layer; and forming oxide side walls on side faces of the phase shift layer pattern by selectively oxidizing the side faces of the phase shift layer pattern when a CD of the phase shift layer pattern is estimated to be smaller than a target CD.

17. The method of claim 16, wherein the polymer layer is formed by depositing a gas selected from the group consisting of difluoromethane ($CH_2F_2$), octafluorobuthene ($C_4F_8$) and hexafluorobutyne ($C_4F_6$), or plasma of oxygen gas and argon gas onto the oxide side walls, and the light shielding layer pattern.

18. The method of claim 16, wherein forming the oxide side walls comprises: oxidizing the side faces of the phase shift layer pattern with oxygen ($O_2$) plasma or ozone ($O_3$) plasma.

19. The method of claim 16, wherein the oxide side walls are formed by oxidation growth to a width of about 30 Å to about 50 Å, which is larger than a width of the phase shift layer pattern expected to be lost during cleaning, so as to protect the phase shift layer pattern during cleaning.

20. The method of claim 16, wherein cleaning the substrate comprises using a cleaning solution comprising sulfuric acid ($H_2SO_4$), hydrogen peroxide ($H_2O_2$), and water ($H_2O$).

21. The method of claim 16, wherein the cleaning is performed using a cleaning solution comprising ammonium ($NH_4OH$), hydrogen peroxide ($H_2O_2$), and water ($H_2O$).

22. A method for fabricating a mask, comprising:

depositing a phase shift layer on a transparent substrate;

depositing a light shielding layer on the phase shift layer;

forming a light shielding layer pattern and a phase shift layer pattern by selectively etching the light shielding layer and the phase shift layer;

measuring a CD of the phase shift layer pattern and determining whether the CD of the phase shift layer pattern is within a process tolerance of a target CD;

forming correction side walls on side faces of the phase shift layer pattern when the CD of the phase shift layer pattern is determined to be smaller than the target CD; and selectively removing a portion of the light shielding layer pattern.

23. The method of claim 22, wherein the phase shift layer comprises an alloy layer comprising molybdenum (Mo) and silicon (Si), the light shielding layer comprises a chromium (Cr) layer, and the correction side walls are formed of oxide comprising molybdenum (Mo), silicon (Si) and oxygen (O), the oxide having a thickness equal to a thickness of the alloy layer containing molybdenum (Mo) and silicon (Si) and having the same phase shift ability as the alloy layer.

24. The method of claim 22, where forming the correction side walls comprises oxidizing the side faces of the phase shift layer pattern using oxygen ($O_2$) plasma or ozone ($O_3$) plasma.

25. The method of claim 24, wherein the correction side walls are formed by oxidation growth to a width of about 30 Å to about 50 Å.

26. The method of claim 22, further comprising, after forming the correction side walls, cleaning the substrate using a cleaning solution comprising sulfuric acid ($H_2SO_4$), hydrogen peroxide ($H_2O_2$), and water ($H_2O$).

27. The method of claim 26, further comprising, before cleaning the substrate, forming a polymer layer which covers the correction side walls and the light shielding layer pattern, wherein the polymer layer absorbs contaminants generated and remaining after forming the light shielding layer pattern and the phase shift layer pattern, wherein cleaning the substrate comprises removing the polymer layer.

28. The method of claim 22, further comprising, after forming the correction side walls, cleaning the substrate using a cleaning solution comprising ammonium ($NH_4OH$), hydrogen peroxide ($H_2O_2$), and water ($H_2O$).

29. A mask, comprising:
a phase shift layer pattern formed on a transparent substrate; and
correction side walls disposed on side faces of the phase shift layer pattern when a CD of the phase shift layer pattern is smaller than a target CD.

30. The mask of claim 29, wherein the phase shift layer pattern comprises an alloy comprising molybdenum (Mo) and silicon (Si), and the correction side walls are formed of an oxide comprising molybdenum (Mo), silicon (Si), and oxygen (O), the oxide having a thickness equal to a thickness of the alloy comprising molybdenum (Mo) and silicon (Si), and having the same phase shift ability as the alloy.

* * * * *